(12) United States Patent
Diner et al.

(10) Patent No.: US 7,429,371 B2
(45) Date of Patent: Sep. 30, 2008

(54) REVERSIBLE OXIDATION OF CARBON NANOTUBES

(75) Inventors: Bruce A. Diner, Chadds Ford, PA (US); Ming Zheng, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 411 days.

(21) Appl. No.: 11/069,604

(22) Filed: Mar. 1, 2005

(65) Prior Publication Data

US 2005/0232844 A1 Oct. 20, 2005

Related U.S. Application Data

(60) Provisional application No. 60/549,313, filed on Mar. 2, 2004, provisional application No. 60/570,160, filed on May 12, 2004.

(51) Int. Cl.
- *B82B 1/00* (2006.01)
- *H01M 4/96* (2006.01)
- *G01N 27/26* (2006.01)
- *C25B 11/02* (2006.01)
- *C25B 11/04* (2006.01)
- *C25B 11/06* (2006.01)
- *C25B 11/12* (2006.01)

(52) U.S. Cl. ............ 423/447.2; 423/447.1; 977/704; 977/742; 977/745; 977/746; 429/105; 204/433; 205/787.5; 205/794.5

(58) Field of Classification Search ............ 423/447, 423/447.2, 447.1; 429/105; 977/704, 742, 977/745, 746; 204/433; 205/787.5, 794.5
See application file for complete search history.

(56) References Cited

U.S. PATENT DOCUMENTS

| | | | | |
|---|---|---|---|---|
| 5,218,304 A * | 6/1993 | Kinlen et al. | ............... | 324/438 |
| 5,866,434 A * | 2/1999 | Massey et al. | ............... | 436/526 |
| 6,031,711 A * | 2/2000 | Tennent et al. | ............... | 361/303 |
| 6,187,823 B1 * | 2/2001 | Haddon et al. | ............... | 516/32 |
| 7,070,753 B2 * | 7/2006 | Niu et al. | ................. | 423/447.1 |
| 7,304,128 B2 * | 12/2007 | Jagota et al. | ................ | 530/327 |
| 2001/0016283 A1 * | 8/2001 | Shiraishi et al. | .......... | 429/218.2 |
| 2003/0010099 A1 * | 1/2003 | Mukasa et al. | ................ | 73/105 |
| 2003/0077515 A1 * | 4/2003 | Chen et al. | ............... | 429/231.8 |
| 2003/0102585 A1 * | 6/2003 | Poulin et al. | .................. | 264/11 |
| 2004/0018371 A1 * | 1/2004 | Mao | ........................... | 428/545 |
| 2004/0034177 A1 * | 2/2004 | Chen | ........................... | 525/416 |
| 2004/0132072 A1 * | 7/2004 | Zheng et al | ................... | 435/6 |
| 2004/0206942 A1 * | 10/2004 | Hsu | ........................... | 252/500 |

OTHER PUBLICATIONS

Rajdip Bandyopadhyaya, Einat Nativ-Roth, Oren Regev, Rachel Yerushalmi-Rozen, Stabilization of Individual Carbon Nanotubes in Aqueous Solutions, Nov. 22, 2001, American Chemical Society, Nano Letters, 2002, vol. 2, No. 1, 25-28.*

(Continued)

*Primary Examiner*—Timothy C. Vanoy
*Assistant Examiner*—Serena L Hanor (57) ABSTRACT

Carbon nanotubes have been reversibly and readily oxidized and reduced with common chemicals in solution, thereby allowing the nanotubes to be used as catalysts for chemical reactions and as stable charge storage devices.

11 Claims, 10 Drawing Sheets

OTHER PUBLICATIONS

Eugenia Buzaneva et al, DNA nanotechnology of carbon nanotube cells: physico-chemical models of self-organization and properties, 2002, Materials Science and Engineering, C 19, 41-45.*

A.B. Dalton et al, A functional conjugated polymer to process, purify and selectively interact with single wall carbon nanotubes, 2001, Synthetic Metals, 121, 1217-1218.*

Yao Wang, Jun Wu, Fei Wei, A treatment method to give separated multi-walled carbon nanotubes with high purity, high crystallizaiton and a large aspect ratio, 2003, Carbon, 41, 2939-2948.*

Jian Chen et al, Solution Properties of Single-Walled Carbon Nanotubes, 1998, Science, vol. 282, 95-98.*

Linqin Jiang, Lian Gao, Jing Sun, Production of aqueous colloidal dispersions of carbon nanotubes, 2003, Journal of Colloid and Interface Science, 260, 89-94.*

Michael J. O'Connell et al, Reversible water-solubilization of single-walled carbon nanotubes by polymer wrapping, 2001, Chemical Physics Letters, 342, 265-271.*

M. S. P. Shaffer et al, Dispersion and Packing of Carbon Nanotubes, 1998, Carbon, vol. 36, No. 11, 1603-1612.*

Olga P. Matyshevska et al, Self-organizing DNA/carbon nanotube molecular films, 2001, Materials Science and Engineering, C 15, 249-242.*

A. B. Dalton et al, Selective Interaction of a Semiconjugated Organic Polymer with Single-Wall Nanotubes, 2000, Journal of Physical Chemistry B, 104, 10012-10016.*

Eugen Unger et al, Electrochemical functionalization of multi-walled carbon nanotubes for solvation and purification, 2002, Current Applied Physics 2, 107-111.*

Leszek Stobinski et al, Single-walled carbon nanotube-amylopectin complexes, 2003, Carbohydrate Polymers, 51, 311-316.*

Nakashima et al., DNA Dissolves Single-walled Carbon Nanotubes in Water, 2003, Chemistry Letters, 32, 456-457.*

P. Petit et al., Tuning and monitoring the electronic structure of carbon nanotubes, Chemical Physics Letters, 305:370-374, 1999.

Ladislav Kavan et al., In situ Raman and Vis-NIR spectroelectrochemistry at single-walled carbon nanotubes, Chemical Physics Letters, 328:363-368, 2000.

Michael S. Strano et al., Reversible, Band-Gap-Selective Protonation of Single-Walled Carbon Nanotubes in Solution, J. Phys. Chem. B, 107:6979-6985, 2003.

* cited by examiner

REVERSIBLE OXIDATION OF CARBON NANOTUBES

This Application claims the benefit of U.S. Provisional Patent Application 60/549,313, filed Mar. 2, 2004, now pending and U.S. Provisional Patent Application 60/570,160, filed May 12, 2004, now pending.

FIELD OF INVENTION

This invention describes a new type of reversible redox reaction of carbon nanotubes in aqueous solution.

BACKGROUND

Carbon nanotubes (CNT) have been the subject of intense research since their discovery in 1991. CNT's possess unique properties such as small size, considerable stiffness, and electrical conductivity, which makes them suitable in a wide range of applications, including use as structural materials and in molecular electronics, nanoelectronic components, and field emission displays. Carbon nanotubes may be either multi-walled (MWNTs) or single-walled (SWNTs), and have diameters in the nanometer range.

Little work has been done on the unique chemical properties of carbon nanotubes in solution phase. As an extended conjugated double-bond system with high surface area, carbon nanotubes are expected to stabilize and accumulate charges far better than small molecules. The accumulated charges on a carbon nanotube can be potentially used for redox reactions that are hard to carry out using small molecules.

Methods of manipulating charges on carbon nanotubes by chemical doping and electrochemical control have been reported (Petit, P., et al, *Chemical Physics Letters* 305, 370-374 (1999); Kavan, L., et al., *Chemical Physics Letters* 328, 363-368 (2000)). While chemical doping methods and electrochemical processes are conceptually identical to oxidation and reduction, there is a fundamental difference between what has been reported and our method. All the previous experiments were conducted in solid phase with carbon nanotubes mounted on a substrate.

Strano and collaborators have reported a marked sensitivity of the optical transitions to pH in carbon nanotubes dispersed by a surfactant (Strano, M. S. et al. *Journal of Physical Chemistry B* 107, 6979-6985 (2003)). They further showed that the pH effect was dependent on the presence of $O_2$.

Applicants have shown that dispersed carbon nanotubes can be reversibly and readily oxidized and reduced with common chemicals in solution, thereby allowing the carbon nanotubes to be used as catalysts for chemical reactions and for photoelectrochemical reactions if charge separation is created by light absorption.

SUMMARY OF THE INVENTION

The invention provides a stable charge storage device comprising at least one oxidized carbon nanotube in solution. Particularly provided is a stable charge storage device where the carbon nanotube is in the form of dispersed nanotubes.

In another embodiment the invention provides a process to catalyze a redox reaction comprising: contacting at least one carbon nanotube with: a) an oxidizing agent and an oxidizable compound or b) a reducing agent and a reducible compound, wherein the redox reaction is catalyzed.

Also provided is a process for altering the reduction potential of a carbon nanotube in solution comprising contacting the carbon nanotube with a dispersant.

Also provided is a process for selecting the reduction potential of a carbon nanotube comprising: a) determining the diameter of a carbon nanotube; and b) correlating the diameter of step (a) with the reduction potential of the carbon nanotube.

Also provided is a process for altering the number of valence electrons in a carbon nanotube comprising contacting a carbon nanotube with an oxidizing agent or a reducing agent.

Also provided is a stable charge transfer reagent comprising at least one oxidized or reduced carbon nanotube in solution.

Also provided is a pH sensor comprising at least one oxidized or reduced carbon nanotube in solution.

Also provided is a photovoltaic cell comprising a film comprising carbon nanotubes.

Also provided is a photovoltaic cell comprising: a) an optically transparent, electronically conductive substrate; b) a film comprising carbon nanotubes in contact with a); c) an electrolyte comprising a redox reagent in contact with b); and d) an electrically conductive cathode in contact with c.

DETAILED DESCRIPTION OF THE INVENTION

The invention is related to a stable charge storage device and to a charge transfer reagent comprising at least one oxidized carbon nanotube in solution. It has been found that carbon nanotubes can be reversibly and readily oxidized and reduced with common chemicals in solution, enabling the storage of charges that are stable, and that can be transferred.

In this disclosure the following terms and abbreviations may be used for the interpretation of the claims and specification.

"cDNA" means complementary DNA
"PNA" means peptide nucleic acid
"ssDNA" means single stranded DNA
"tRNA" means transfer RNA
"CNT" means carbon nanotube "MWNT" means multi-walled nanotube "SWNT" means single walled nanotube For the purposes of this invention, "oxidized" refers to the state of a substance that has lost one or more negative charges in the form of electrons. "Reduced" refers to the state of a substance that has gained one or more negative charges in the form of electrons. A "redox" reaction refers to a reaction in which at least one substance is oxidized and at least one substance is reduced. "Oxidizing agent" is defined as a substance that readily accepts electrons in a redox reaction. "Reducing agent" is defined as a substance that readily donates electrons in a redox reaction. An "oxidizable compound" is a substance that can be oxidized by an oxidizing agent. A "reducible compound" is a substance that can be reduced by a reducing agent.

"Reduction potential" is the relative tendency of a compound to act as an electron donor or acceptor and is usually measured as the redox potential at which a species is oxidized or reduced under standard conditions. Typically the reduction potential is relative to the standard hydrogen electrode.

As used herein the term "charge storage device" refers to a device or material that has the ability to accumulate and store either a positive of negative charge. Preferred storage devices of the invention are carbon nanotubes in solution.

As used herein the term "charge transfer reagent" refers to a material that that has the ability to transfer either a positive or negative charge from one material to another. Preferred charge transfer reagents of the invention are carbon nanotubes in solution.

By "in solution" it is meant for the purposes of this invention that the nanotubes are either dissolved or suitably dispersed in the solvent. Any method known in the art can be used to dissolve or disperse the nanotubes. Any solvent or mixture of solvents can be used provided that it is inert to all reagents and products. Examples of solvents that can be used include water and organic solvents such as but not limited to dichlorobenzene, methanol, ethanol, and isopropanol.

As used herein a "nucleic acid molecule " is defined as a polymer of RNA, DNA, or peptide nucleic acid (PNA) that is single- or double-stranded, optionally containing synthetic, non-natural or altered nucleotide bases. A nucleic acid molecule in the form of a polymer of DNA may be comprised of one or more segments of cDNA, genomic DNA or synthetic DNA.

The letters "A", "G", "T", "C" when referred to in the context of nucleic acids will mean the purine bases adenine ($C_5H_5N_5$) and guanine ($C_5H_5N_5O$) and the pyrimidine bases thymine ($C_5H_6N_2O_2$) and cytosine ($C_4H_5N_3O$), respectively.

The term "peptide nucleic acids" refers to a material having stretches of nucleic acid polymers linked together by peptide linkers.

As used herein the term "stabilized solution of nucleic acid molecules" refers to a solution of nucleic acid molecules that are solubilized and in a relaxed secondary conformation.

The invention provides a charge storage device which consists of least one oxidized or reduced carbon nanotube in solution Carbon Nanotubes The term "carbon nanotube" refers to a hollow article composed primarily of carbon atoms. The carbon nanotube can be doped with other elements, e.g., metals. The nanotubes typically have a narrow dimension (diameter) of about 1-200 nm and a long dimension (length), where the ratio of the long dimension to the narrow dimension, i.e., the aspect ratio, is at least 5. In general, the aspect ratio is between 10 and 2000.

Carbon nanotubes of the invention are generally about 0.5-2 nm in diameter where the ratio of the length dimension to the narrow dimension, i.e., the aspect ratio, is at least 5. In general, the aspect ratio is between 10 and 2000. Carbon nanotubes are comprised primarily of carbon atoms, however they may be doped with other elements, e.g., metals. The carbon-based nanotubes of the invention can be either multi-walled nanotubes (MWNTs) or single-walled nanotubes (SWNTs). A MWNT, for example, includes several concentric nanotubes each having a different diameter. Thus, the smallest diameter tube is encapsulated by a larger diameter tube, which in turn, is encapsulated by another larger diameter nanotube. A SWNT, on the other hand, includes only one nanotube.

Carbon nanotubes (CNT) may be produced by a variety of methods, and are additionally commercially available. Methods of CNT synthesis include laser vaporization of graphite (A. Thess et al. *Science* 273, 483 (1996)), arc discharge (C. Journet et al., *Nature* 388, 756 (1997)) and HiPCo (high pressure carbon monoxide) process (P. Nikolaev et al. *Chem. Phys. Lett.* 313, 91-97 (1999)). Chemical vapor deposition (CVD) can also be used in producing carbon nanotubes (J. Kong et al. *Chem. Phys. Lett.* 292, 567-574 (1998); J. Kong et al. *Nature* 395, 878-879 (1998); A. Cassell et al. *J. Phys. Chem.* 103, 6484-6492 (1999); H. Dai et al. *J. Phys. Chem.* 103,11246-11255 (1999)).

Additionally CNT's may be grown via catalytic processes both in solution and on solid substrates (Yan Li, et al., *Chem. Mater.;* 2001; 13(3); 1008-1014); (N. Franklin and H. Dai *Adv. Mater.* 12, 890 (2000); A. Cassell et al. *J. Am. Chem. Soc.* 121, 7975-7976 (1999)).

Most CNT's, as presently prepared, are in the form of entangled tubes. Individual tubes in the product differ in diameter, chirality, and number of walls. Moreover, long tubes show a strong tendency to aggregate into "ropes" held together by Van der Waals forces. These ropes are formed due to the large surface areas of nanotubes and can contain tens to hundreds of nanotubes in one rope.

Dispersion of Carbon Nanotubes

The carbon nanotubes may be dispersed in the solution by any means known in the art, such as but not limited to dispersion with detergents and surfactants such as sodium dodecylsulfate, alkyl benzene sulfonate, dextrin, polyethylene oxide, alkyl-ether sulfonate and Triton® series compounds, ultrasonication, wrapping with polymers such as polyvinylpyrrolidone, polysaccharides, polypeptides, gum arabic, and polystyrene sulfonate, and chemical functionalization of the nanotube surface. The dispersants used may be charged or uncharged. Many of these techniques are reviewed in Hilding, J., et al., *Journal of Dispersion Science and Technology* (2003), 24(1), 141. More than one dispersant can be used in the same process, including dispersants of different charges, such as but not limited to an uncharged dispersant mixed with an anionic dispersant.

Another method to disperse CNT aggregates is by the use of stabilized solutions of nucleic acid molecules, as described in U.S. patent application Ser. Nos. 10/716346 and 10/716347, incorporated herein by reference. They describe a method for dispersing a population of bundled carbon nanotubes by contacting the bundled nanotubes with a stabilized solution of nucleic acid molecules which comprises:

a) providing a stabilized solution of nucleic acid molecules;

b) contacting a population of carbon nanotubes with an effective amount of the stabilized nucleic acid solution of step (a) for a time sufficient to disperse the carbon nanotubes; and c) optionally recovering the dispersed carbon nanotubes.

The nucleic acid molecules may be of any type and from any suitable source and include but are not limited to DNA, RNA and peptide nucleic acids. The nucleic acid molecules may be either single stranded or double stranded and may optionally be functionalized at any point with a variety of reactive groups, ligands or agents. The nucleic acid molecules of the invention may be generated by synthetic means or may be isolated from nature by protocols well known in the art (Sambrook, J., Fritsch, E. F. and Maniatis, T., Molecular Cloning: A Laboratory Manual, Second Edition, Cold Spring Harbor Laboratory Press, Cold Spring Harbor, N.Y. (1989)).

Peptide nucleic acids (PNA) may also be used as they possess the double functionality of both nucleic acids and peptides. Methods for the synthesis and use of PNA's are well known in the art, see for example Antsypovitch, S. I. *Peptide nucleic acids: structure Russian Chemical Reviews* (2002), 71(1), 71-83.

The nucleic acid molecules may have any composition of bases and may even consist of stretches of the same base (poly A or poly T for example) without impairing the ability of the nucleic acid molecule to disperse the bundled nanotube. Preferably the nucleic acid molecules will be less than about 2000 bases where less than 1000 bases is preferred and where from about 5 bases to about 1000 bases is most preferred. Generally the ability of nucleic acids to disperse carbon nanotubes appears to be independent of sequence or base composition, however there is some evidence to suggest that the less G-C and T-A base-pairing interactions in a sequence, the higher the dispersion efficiency, and that RNA and varieties thereof is particularly effective in dispersion and is thus preferred herein. Nucleic acid molecules suitable for use in the present invention include but are not limited to those having the general formula:

1. $A_n$ wherein n=1–2000;
2. $T_n$ wherein n=1–2000;
3. $C_n$ wherein n=1–2000;
4. $G_n$ wherein n=1–2000;
5. $R_n$ wherein n=1–2000, and wherein R may be either A or G;
6. $Y_n$ wherein n=1–2000, and wherein Y may be either C or T;
7. $M_n$ wherein n=1–2000, and wherein M may be either A or C;
8. $K_n$ wherein n=1–2000, and wherein K may be either G or T;
9. $S_n$ wherein n=1–2000, and wherein S may be either C or G;
10. $W_n$ wherein n=1–2000, and wherein W may be either A or T;
11. $H_n$ wherein n=1–2000, and wherein H may be either A or C or T;
12. $B_n$ wherein n=1–2000, and wherein B may be either C or G or T;
13. $V_n$ wherein n=1–2000, and wherein V may be either A or C or G;
14. $D_n$ wherein n=1–2000, and wherein D may be either A or G or T; and
15. $N_n$ wherein n=1–2000, and wherein N may be either A or C or T or G;

In addition to the combinations listed above the person of skill in the art will recognize that any of these sequences may have one or more deoxyribonucleotides replaced by ribonucleotides (i.e., RNA or RNA/DNA hybrid) or one or more sugar-phosphate linkages replaced by peptide bonds (i.e. PNA or PNA/RNA/DNA hybrid).

Once the nucleic acid molecule has been prepared it must be stabilized in a suitable solution. It is preferred if the nucleic acid molecules are in a relaxed secondary conformation and only loosely associated with each other to allow for the greatest contact by individual strands with the carbon nanotubes. Stabilized solutions of nucleic acids are common and well known in the art (see Sambrook supra) and typically include salts and buffers such as sodium and potassium salts, and TRIS (Tris(2-aminoethyl)amine), HEPES (N-(2-hydroxyethyl)piperazine-N'-(2-ethanesulfonic acid), and MES(2-(N-Morpholino)ethanesulfonic acid. Preferred solvents for stabilized nucleic acid solutions are those that are water miscible where water is most preferred.

Once the nucleic acid molecules are stabilized in a suitable solution they may be contacted with a population of bundled carbon nanotubes. It is preferred, although not necessary if the contacting is done in the presence of an agitation means of some sort. Typically the agitation means employs sonication for example, however may also include, devices that produce high shear mixing of the nucleic acids and nanotubes (i.e. homogenization), or any combination thereof. Upon agitation the carbon nanotubes will become dispersed and will form nanotube-nucleic acid complexes comprising at least one nucleic acid molecule loosely associated with the carbon nanotube through van der Waals interactions and possibly aided by hydrogen bonding.

The process of agitation and dispersion may be improved with the optional addition of nucleic acid denaturing substances to the solution. Common denaturants include but are not limited to formamide, urea and guanidine. A non-limiting list of suitable denaturants may be found in Sambrook supra.

Catalysis of Redox Reactions

The invention is also directed to a process to catalyze a redox reaction comprising: contacting at least one carbon nanotube with: a) an oxidizing agent and an oxidizable compound or b) a reducing agent and a reducible compound, wherein the redox reaction is catalyzed.

The invention is also directed to a process for altering the number of valence electrons in a carbon nanotube comprising contacting a carbon nanotube with an oxidizing agent or a reducing agent.

One of the advantages of the nanotube as a catalyst is its large surface area relative to that of the redox reactants. By having each redox reactant interact with the nanotube as well as with each other, the rate of electron exchange between the reactants is increased. Oxidizing equivalents generated by a molecule at one location along a nanotube may be used to oxidize another molecule at a distance, as diagrammed below:

Examples of oxidizing agents suitable for used in the instance invention include, but are not limited to, 2,3-dichloro-5,6-dicyano-p-benzoquinone, benzoyl peroxide, chloranil, chlorine, dichlorodicyanobenzoquinone, dichlorodicyano-p-benzoquinone, diphenylbenzoquinone, divalent chromium, formate, glucose, hexachloroiridate, hydrogen peroxide, hyperoxide, hyperchlorous, hypophosphite, iodine,naphthoquinone, N-bromosuccinimide, N-chlorosuccinimide, N-iodosuccinimide, nitrate, nitric acid, nitrous acid, o-benzoquinone, o-chloranil, o-iodobenzoate, oxygen, ozone, p-benzoquinone, p-chloranil, peracetic acid, perborate, perboric acid, perchlorate, perchloric acid, permanganate, permanganic acid, peroxide, peroxyacids, perphosphoric acid, persulfate, persulfuric acid, pertitanate, pervanadate, p-toluquinone, ribose, saccharose, perforate, stannous, stilbenequinone, sulfite, sulfur, sulfuric acid, tetrathionate, trivalent titanium, and trivalent vanadium.

Examples of reducing agents include, but are not limited to, 9,10-diphenylanthracene radical anion, acid chlorides, acridine anion, alkali metal sulfates, aluminum sulfates, anthraquinol, benzophenone anion, bisulfite, boranes, borates, carbon monoxide, chromium(II) salts, diimine, dithionite, formic acid, Group I & II metals, hydrazine, hydrides, hydrogen, hydrosulfite, iron(II) salts, lithium aluminum hydride, low-valence titanium ions, naphthalene radical-anion, nitrous acid, N-n-butylphthalimide anion, niobium (ill) salts, perylene radical anion, phenanthridine radical-anion, phosphates, phosphines, phthalonitrile anion, polyphosphates, reducing sugars, sodium borohydride, sulfides, thiosulfate, tranisition metals, trans-stilbene anion, and vanadium(II) salts.

In order to serve as a catalyst the carbon nanotube of the invention will generally be in solution in the presence of redox reactants. Typically the solution will be aqueous based and at an acid pH where any pH of less than 7.0 is suitable. Alternatively organic solvents may be employed either alone or admixed with water. Suitable organic solvents will include, but are not limited to dichlorobenzene, methanol, ethanol, and isopropanol.

Tuning of Reduction Potential

One of the distinct advantages for the use of a carbon nanotube as a charge storage device is that fact that it will be possible to "tune" or calibrate the reduction potential of the catalyst to accommodate the specific needs of any particular redox reaction. It has been noted for example that the present CNT's may be dispersed in a variety of ways including in detergents and by wrapping the CNT in polymers, particularly nucleic acids. It has been observed that the reduction potential of the catalyst may be altered depending on the type of dispersant used. For example CNT's dispersed in neutral detergents are expected to have a reduction potential of about 1100 mv to about 500 mv, whereas the reduction potential of a CNT wrapped in a nucleic acid is expected to be about 900 mv to about 500 mv.

Alternatively the calibration of the reduction potential may be accomplished by selecting CNT's of a particular diameter. Physical characterization such as the determination of CNT diameter is easily measured by means such as Resonance Raman spectroscopy, scanning tunneling microscopy, the methods of which are reviewed in *Physical Properties of Carbon Nanotubes* by R. Saito, G Dresselhaus and M. S. Dresselhaus (Imperial College Press). For example it has been observed that CNT's having a relatively small diameter (from about 0.7 nm to about 0.8 nm for example) have a relatively high reduction potential (from about 820 mv to about 780 mv), whereas those CNT's having a relative large diameter (from about 1.0 nm to about 1.1 nm) will have a lower reduction potential (from about 760 mv to about 720 mv).

Thus the invention is directed to a process for altering the reduction potential of a carbon nanotube in solution comprising contacting the carbon nanotube with a dispersant, and to a process for selecting the reduction potential of a carbon nanotube comprising: a) determining the diameter of a carbon nanotube; and b) correlating the diameter of step (a) with the reduction potential of the carbon nanotube.

The person of skill in the art will recognize that this ability to calibrate reduction potential either by the use of dispersants or by selecting for morphological characteristics of the nanotube may be expanded upon given the teaching of the invention and are not necessarily limited to the specific instances mentioned here.

Photovoltaic cells using nanoparticles and conducting films have been described in the art (A. Hagfeldt, Acc. Chem. Res. 2000, 33, 269-277 and M Grätzel, Nature, Vol 414, 15 Nov. 2001, 338-342). The carbon nanotubes of the present invention that are able to be reversibly oxidized and reduced can be used in such a device.

Figure 7:
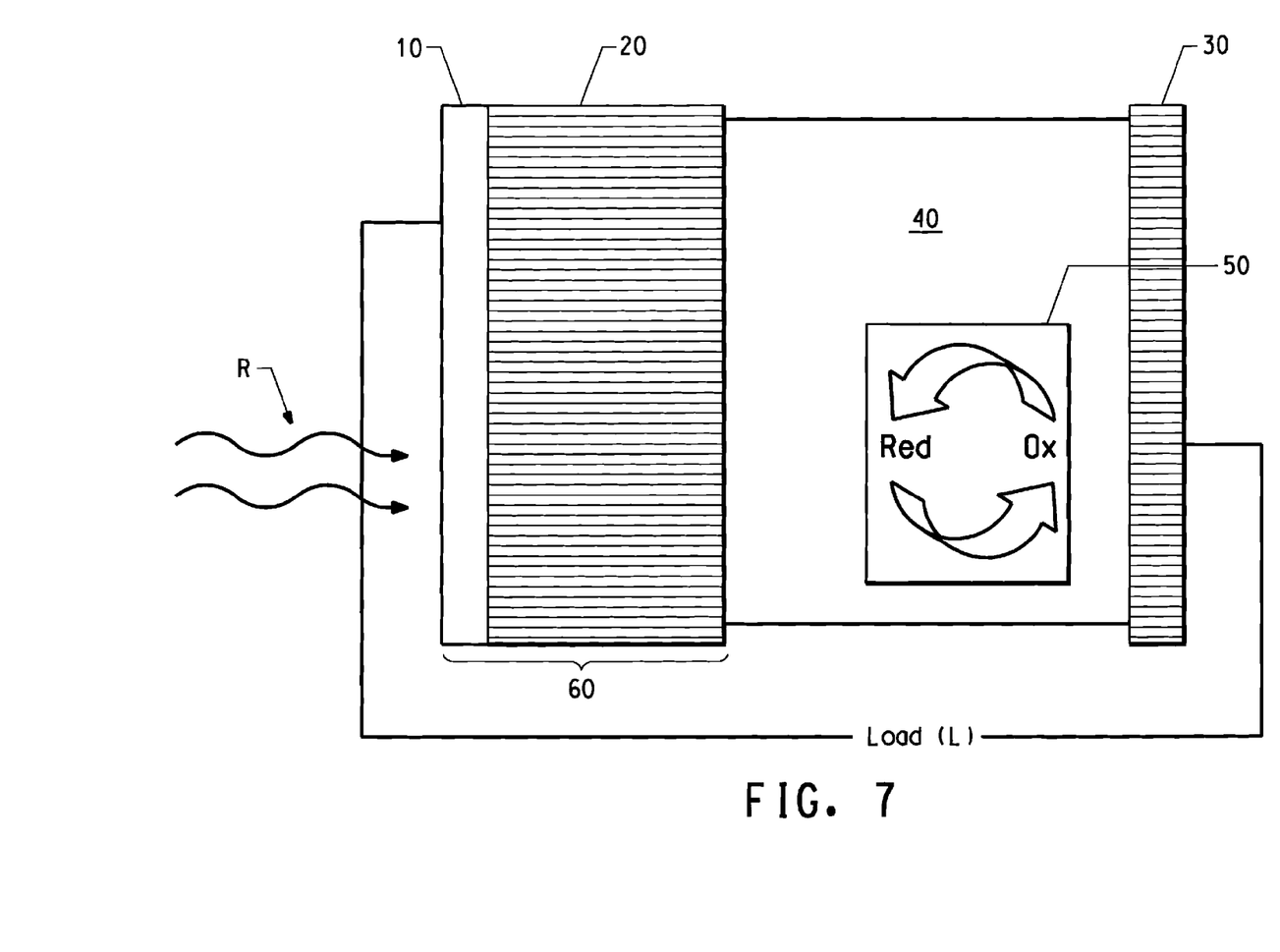
FIG. 7 is a diagram of a possible embodiment of a carbon nanotube based photovoltaic cell.

One embodiment of a photovoltaic cell comprising carbon nanotubes is a layered assemblage as shown in FIG. 7. An optically transparent, electronically conductive substrate (10), which is transparent to electromagnetic radiation, such as but not limited to visible, ultraviolet, near-ultraviolet, infrared, and/or near-infrared wavelengths; is coated with or in contact with a film comprising the carbon nanotubes (20). The film can be prepared from carbon nanotubes or prepared from another substrate containing carbon nanotubes. An electrolyte (40) comprising a redox mediator (50) is in electrical contact with the carbon nanotube (20). The electrolyte may be either solid or liquid. An electrically conductive cathode (30) in electrical contact with the electrolyte (40). In use, the electromagnetic radiation (R) passes through conducting substrate (10) and is absorbed by film (20). An electrical potential is produced across the cell, which can be used to power a load (L).

EXAMPLES

The present invention is further defined in the following Examples. It should be understood that these Examples, while indicating preferred embodiments of the invention, are given by way of illustration only. From the above discussion and these Examples, one skilled in the art can ascertain the essential characteristics of this invention, and without departing from the spirit and scope thereof, can make various changes and modifications of the invention to adapt it to various uses and conditions.

The meaning of abbreviations is as follows: "h" means hour(s), "min" means minute(s), "sec" means second(s), "d" means day(s), "mL" means milliliters, "L" means liters, "W" means watts.

Example 1

Obtaining (6,5) Enriched Carbon Nanotubes by Anion Exchange Chromatography

This example describes preparation of carbon nanotube materials to be used for experiments in the subsequent EXAMPLES. The procedure followed is described in U.S. patent application Ser. No. 10/716347. Unpurified single wall carbon nanotubes from Southwest Nanotechnologies (SWeNT, Norman, Okla.) and single-stranded DNA (GT)30 (Integrated DNA Technologies, INC, Coralville, Iowa) were used. Dispersion and separation by anion exchange chromatography were done as described in U.S. patent application Ser. No. 10/716347. This procedure yielded a fraction that was largely enriched with (6, 5) tubes.

Example 2

Redox Titration of (6,5) Enriched Carbon Nanotubes

Figure 1A:
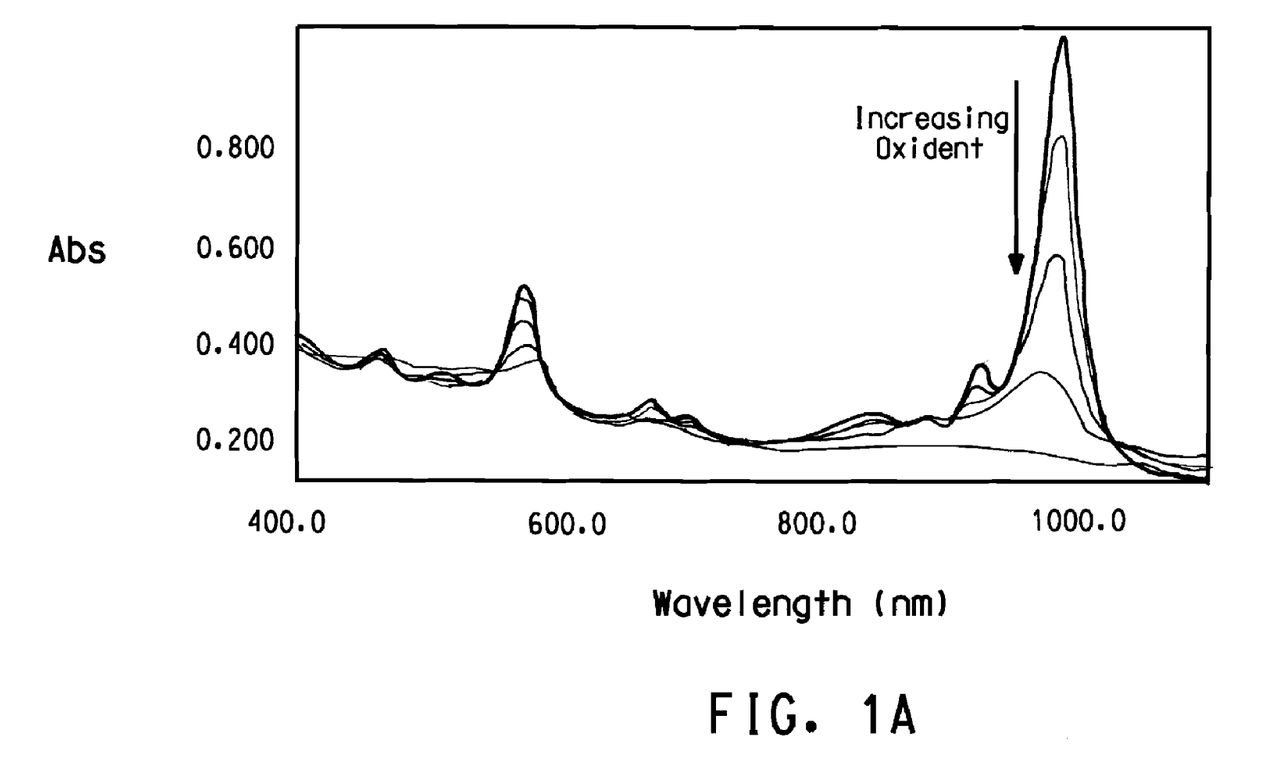
FIG. 1a shows the redox titration of (6,5) enriched carbon nanotubes by $K_2IrCl_6$ as followed by the UV-Vis spectroscopy.

This example describes the basic observation of facile oxidation of carbon nanotubes in aqueous solution by a variety of strong oxidants, including $KMnO_4$, $K_2IrCl_6$, $K_2IrBr_6$, etc. The carbon nanotube materials used here were those described in EXAMPLE 1. Aqueous solution of $K_2IrCl_6$ was freshly made prior to use. To 100 µL of the nanotube solution in water ($OD_{990\,nm}$=0.96) was added the appropriate amount of $K_2IrCl_6$ so that the final concentration of the oxidant was 0.25, 0.5, 1, 2 and 10 µM, respectively. This resulted in a gradual decrease of the E11 transition of the (6,5) tubes at 990 nm. The E11 intensity was found to reach a steady level a few minutes after the addition of the oxidant. FIG. 1A shows the UV-Vis spectra of the reaction mixture obtained 10 min after addition of the various concentrations of $K_2IrCl_6$. Assuming the nanotubes were fully oxidized with 10 µM of $K_2IrCl_6$, and were in the fully reduced state without the oxidant, one could analyze the titration data using the Nernst equation. Such analysis yielded reduction potential $E_{CNT}$~800 mv (vs. SHE) for the (6,5) tube; and the concentration of CNT [CNT]=1.9 µM.

Example 3

Redox Titration of Carbon Nanotubes with Large Diameter Distribution

Figure 1B:
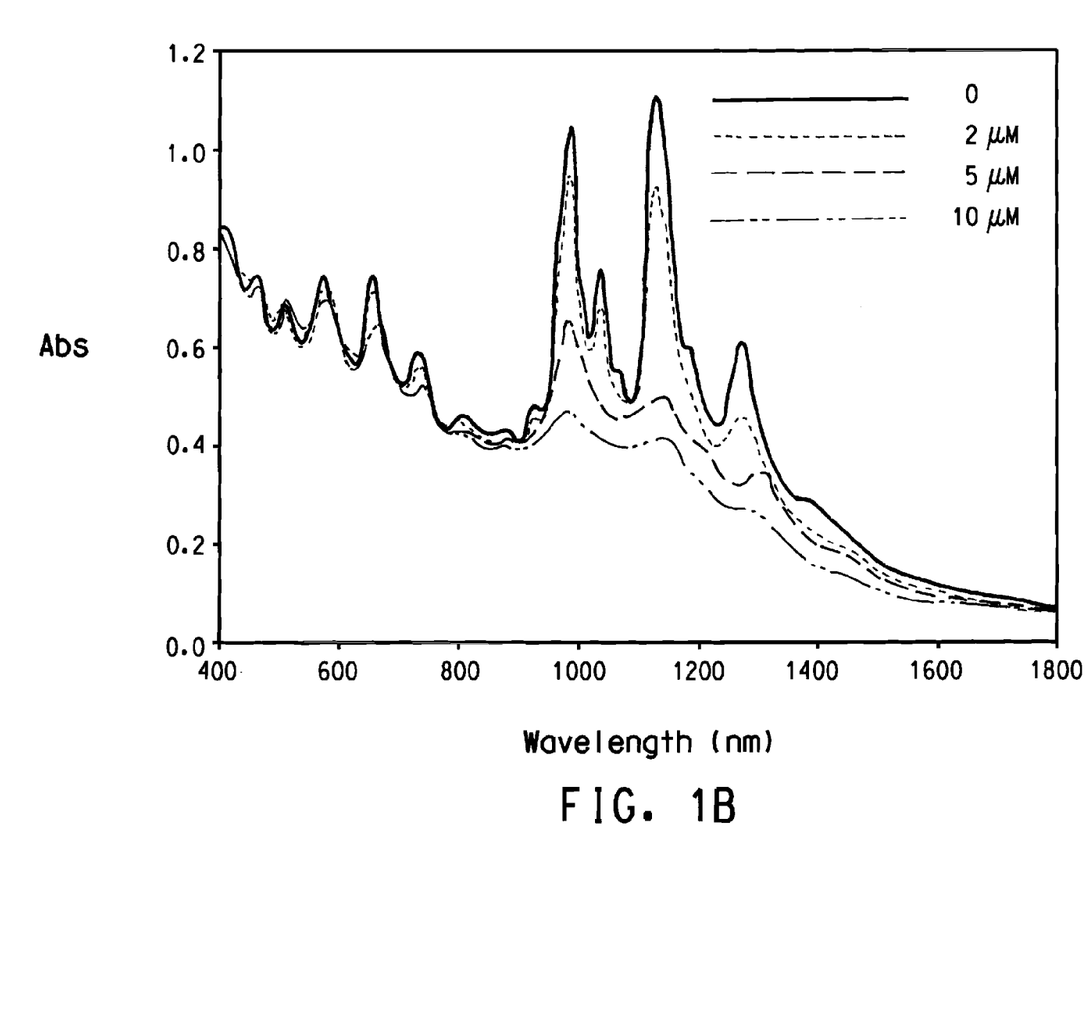
FIG. 1B shows the redox titration of HIPCO carbon nanotubes by different concentrations of K2IrCl6 as followed by the UV-Vis spectroscopy.

This example demonstrates that the redox potential of carbon nanotubes vary systematically as a function of the tube diameter. The experiment was similar to that described in EXAMPLE 2, except that non-fractionated HiPco nanotube dispersed by DNA in aqueous solution was used. By monitoring the change of E11 transitions of different diameter nanotubes, one could find that the larger diameter tubes (those at longer wavelength) were oxidized first when lower concentrations of the oxidant $K_2IrCl_6$ were added; and smaller diameter tubes (those at shorter wavelength) were oxidized only after higher concentrations of the oxidant $K_2IrCl_6$ were added as shown in FIG. 1B. These results indicate that the reduction potential of carbon nanotubes increases as the tube diameters decrease.

Example 4

Reduction of Oxidized (6,5) Carbon Nanotubes

This example demonstrates the reversibility of the carbon nanotube oxidation. Oxidized carbon nanotubes were prepared by the addition of 10 µM (final concentration) $KMnO_4$ in 100 µL of the (6,5) solution ($OD_{990\,nm}$=0.96). To this reaction mixture was added 1 µL of 1 M NaOH. This triggered reduction of the oxidized nanotube by water, as illustrated by the reaction:

$$4CNT^+(oxidized) + H_2O \rightarrow 4CNT^-(reduced) + O_2 + 4H^+$$

Within 10 min or so, the E11 transition of the (6, 5) carbon nanotubes at 990 nm was found to be fully recovered, indicating that the carbon nanotubes were fully reduced.

Example 5

Carbon Nanotubes as Catalysts for Redox Reactions

Figure 2:
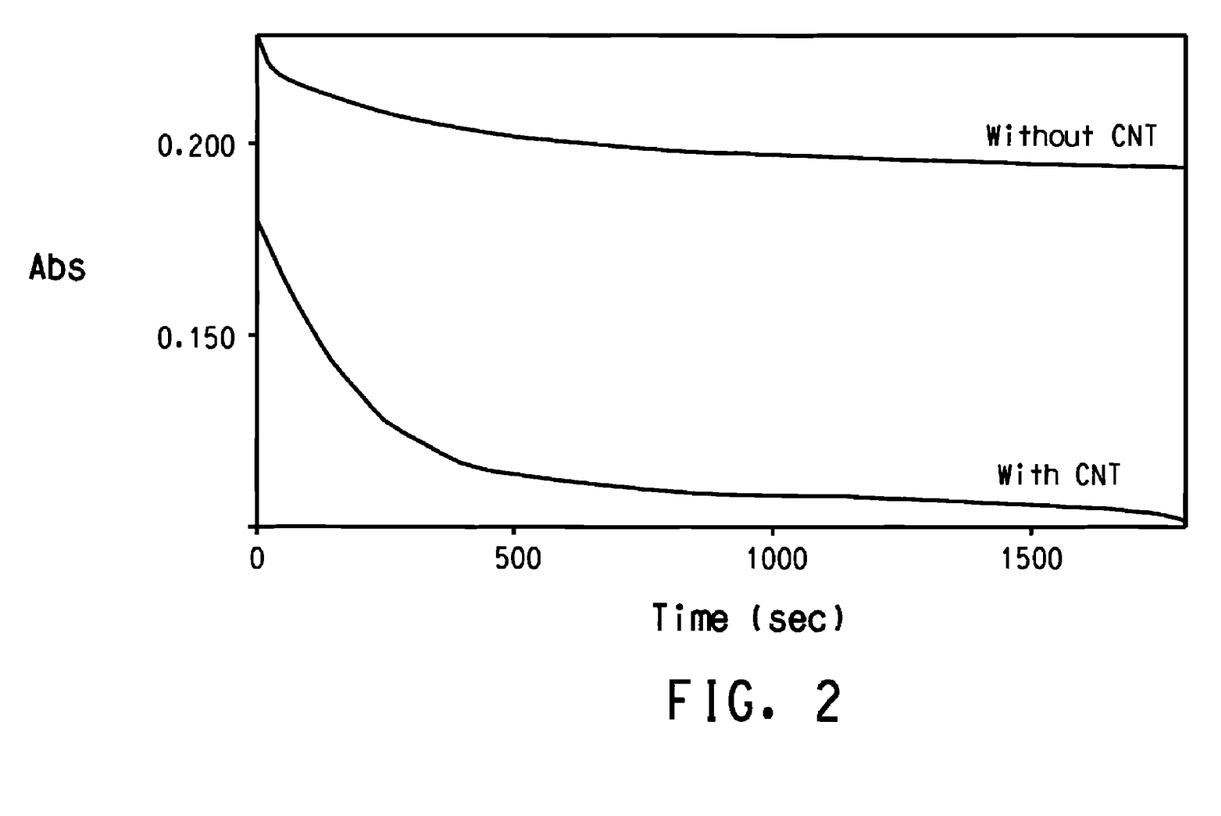
FIG. 2 shows the consumption of $KMnO_4$ in the presence and in the absence of CNT monitored at 526 nm.
Figure 3:
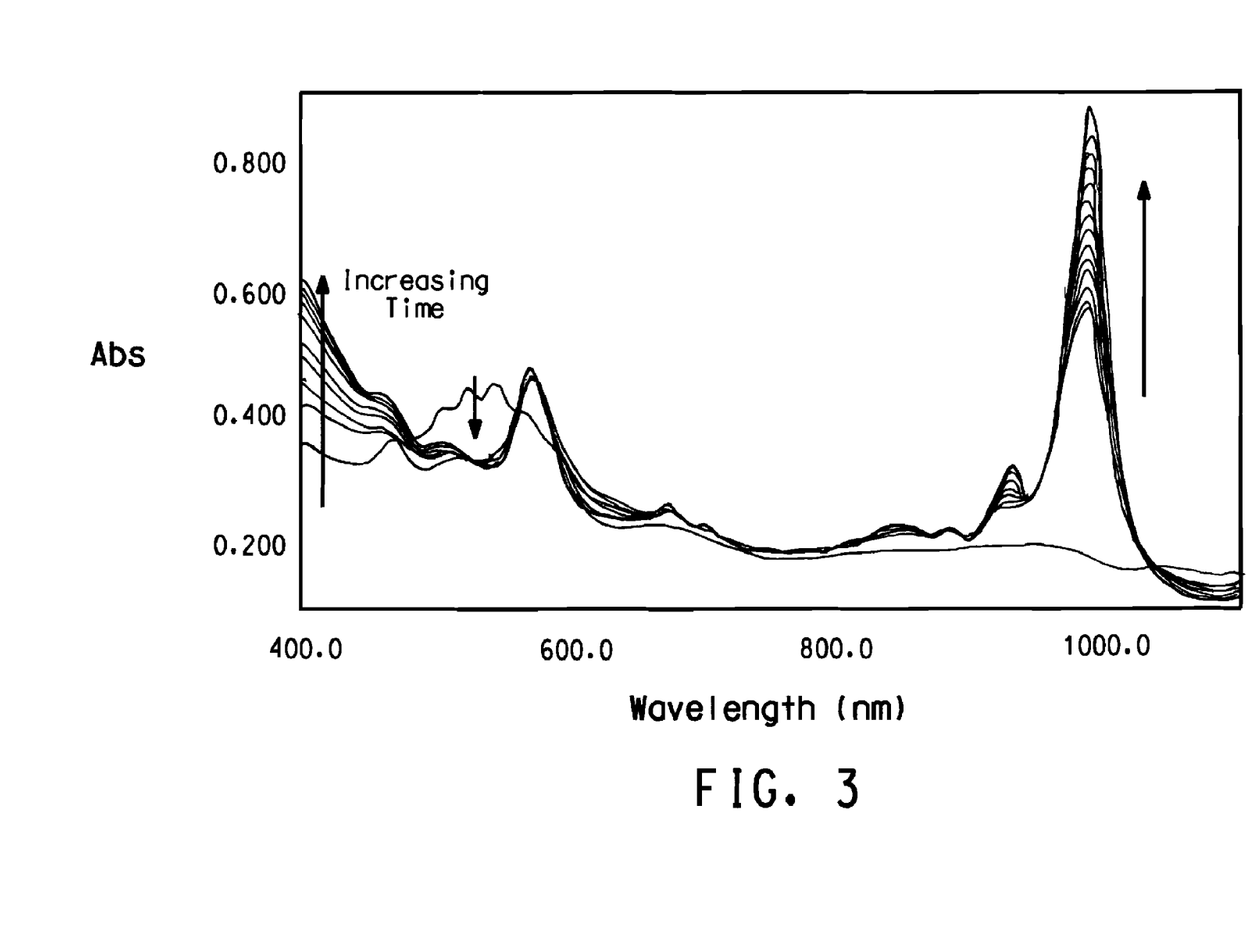
FIG. 3 shows the spectral changes of a $KMnO_4$ and CNT reaction mixture as a function of time as followed by the UV-Vis spectroscopy.

This example describes the use of carbon nanotubes as catalysts for redox reactions, as illustrated in the reaction shown below, where A and D refers to electron acceptor and donor, respectively:

The experiment used $KMnO_4$ as an electron acceptor, and water at pH 11.0 as electron donor. To 100 µL of the (6,5) solution ($OD_{990\,nm}$=0.96) was added 100 µM (final concentration) $KMnO_4$, then to this reaction mixture was added 1 µL of 1 M NaOH. As a control experiment, 1 µL of 1M NaOH was added to 100 µL of 100 µM (final concentration) $KMnO_4$ solution. The consumption of $KMnO_4$ was monitored at 526 nm where $KMnO_4$ has an absorption peak. As shown in FIG. 2, the reduction of $KMnO_4$ was greatly (~100-fold) accelerated by the carbon nanotubes. FIG. 3 illustrates spectral changes of the $KMnO_4$ and CNT reaction mixture as a function of time. A total of 24 spectra were taken over 6 hr period (15 min/spectrum). FIG. 3 shows that carbon nanotubes were fully recovered to the reduced state within 6 hrs or so.

Example 6

Dependence of Reduction Potential of the Carbon Nanotubes on Dispersant Charge HiPco carbon nanotubes (~1 mg/ml) (Carbon Nanotechnologies, Inc., Houston, Tex.) were dispersed by sonication for 60 min at 5 W in 30 ml of aqueous solution of 1 mg/ml Torula Yeast Type VI RNA (Sigma) in 0.1 M NaCl plus 10 mM EDTA, pH 7. The dispersion was spun at 10,000 g for 30 min. The supernatant was then pelleted by centrifugation at 540,000 g for 1 h and washed by dispersion and recentrifugation in 0.1 M NaCl plus 10 mM EDTA, pH 7. HiPco carbon nanotubes (0.25 mg/ml) were also dispersed by homogenization and sonication (cup horn sonicator for 1 h at 500 W) in 200 ml 1 % Triton X-405 in water after which they were centrifuged for 4 h at 141,000 g. The supernatant was concentrated using a YM-100 filter in a Millipore-Amicon ultrafiltration cell. Absorption spectra were recorded of the carbon nanotubes dispersions as is after which spectra were recorded within minutes after the addition of 10 and 100 uM $K_2Ir(Cl)_6$, a powerful oxidant with a reduction potential of 0.96 V vs NHE.

Figure 4A:
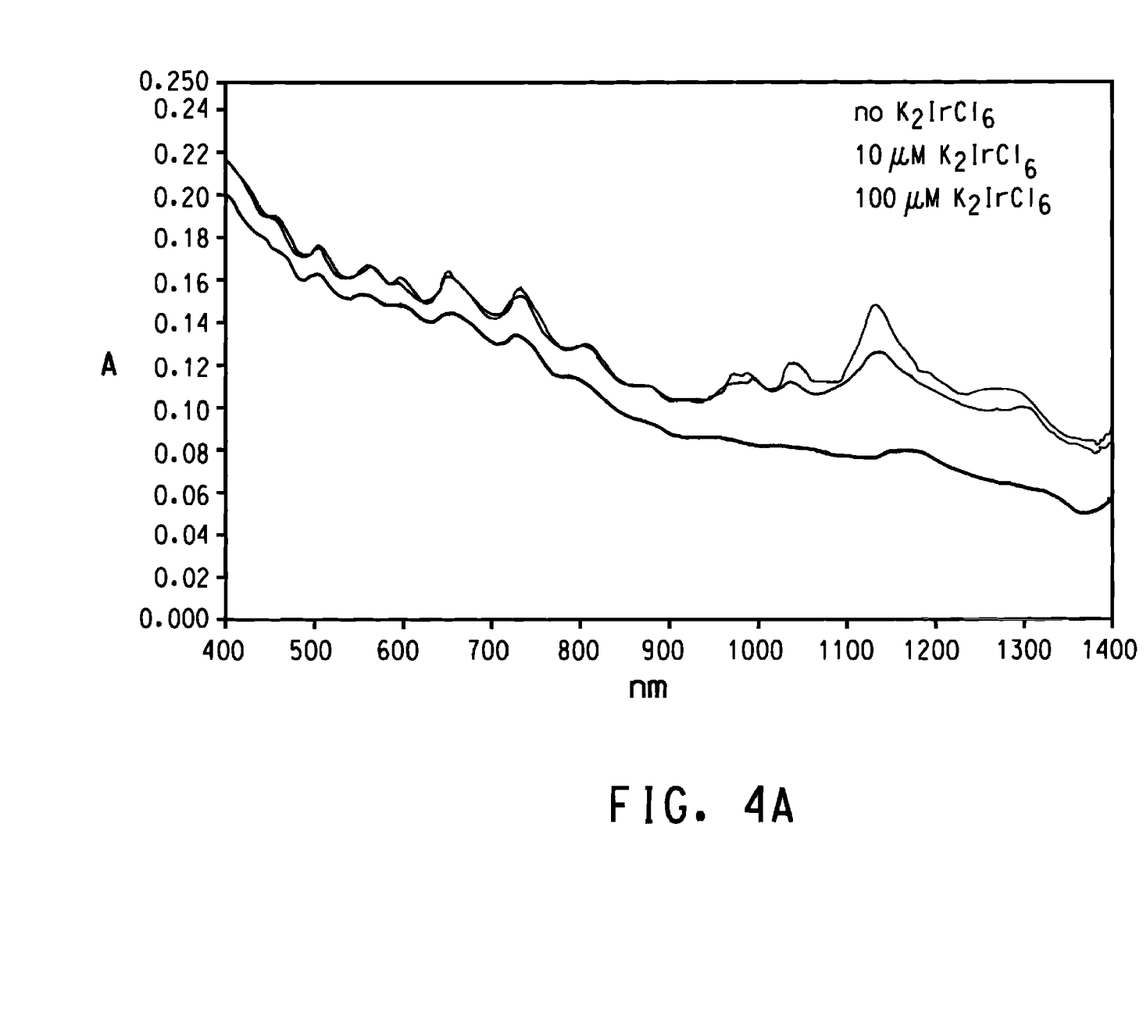
FIGS. 4a and 4b show the titration by $K_2IrCl_6$ of carbon nanotubes dispersed with RNA and with Triton X405 as followed by UV-Vis spectroscopy.
Figure 4B:
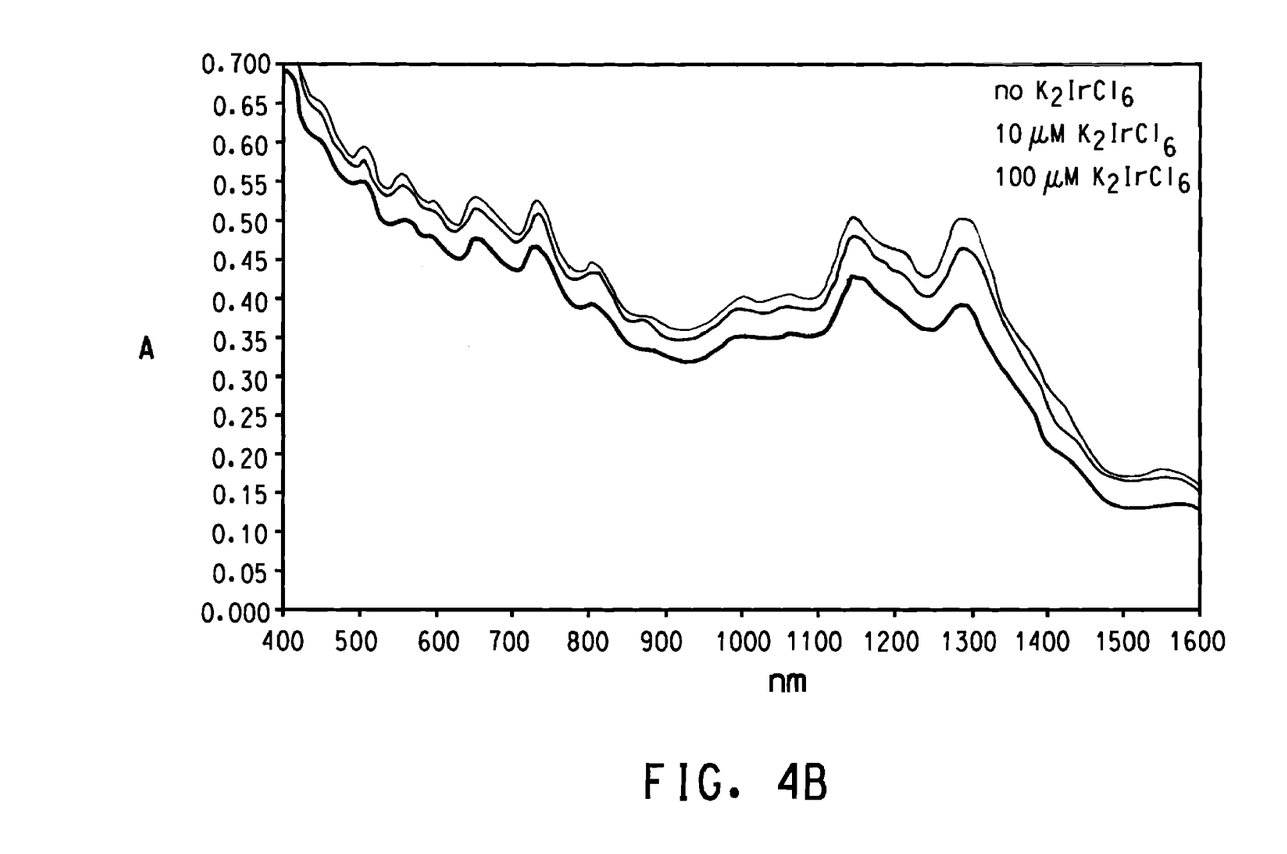

FIGS. 4A and 4B show the absorbance spectrum of each set of carbon nanotubes without further treatment (upper RNA dispersed, lower Triton X-405 dispersed). After the addition of 10 uM $K_2Ir(Cl)_6$, the spectrum of the RNA-dispersed nanotubes was substantially changed with absorbance bands located between 900 and 1400 nm decreased in amplitude by close to one-half. Upon increasing the $K_2Ir(Cl)_6$ concentration to 100 uM these same absorbance peaks disappeared almost entirely. In the case of the Triton X-405 dispersed nanotubes, in the same wavelength range the change in the spectrum was quite small upon addition of 10 uM $K_2Ir(Cl)_6$. Upon increasing the concentration of oxidant to 100 uM, the absorbance bands decreased in amplitude to no less than 50% of the initial value.

The much greater sensitivity of the RNA wrapped nanotubes to the addition of oxidant indicates that these nanotubes are more easily oxidized, having a lower reduction potential than those dispersed in Triton® X405. The lower reduction potential of the RNA-wrapped nanotubes is attributed to the presence of the anionic wrapping polymer which stabilizes the oxidized nanotube over what occurs with Triton® X-405, a non-ionic and therefore uncharged detergent.

Example 7

Reversibility of Redox Potential of Carbon Nanotubes

Figure 5:
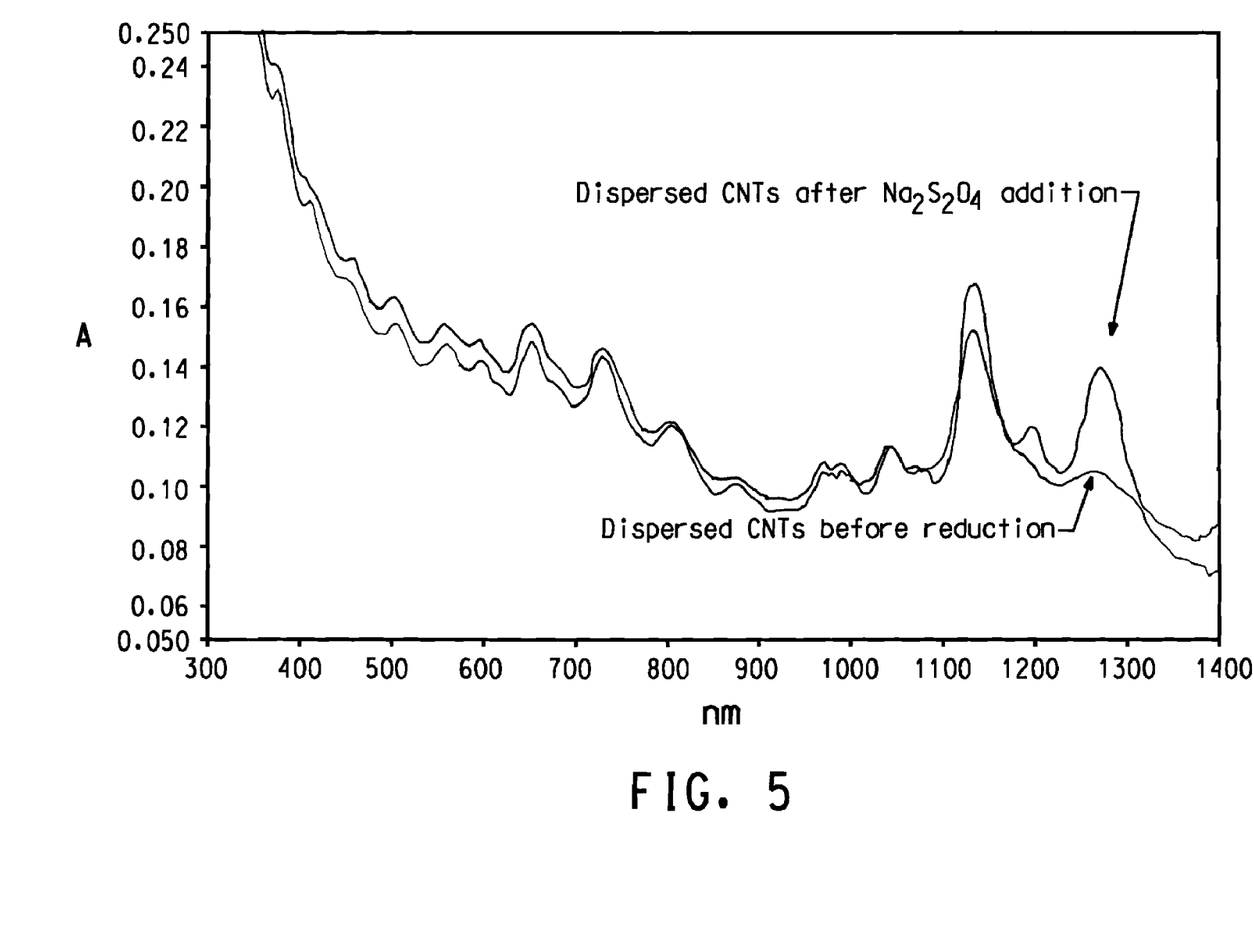
FIG. 5 shows the effect of reductant on RNA-wrapped CNTs as followed by the UV-Vis spectroscopy.

HiPco carbon nanotubes were suspended using Type VI RNA from Torula yeast (Sigma). One mg/mL carbon nanotubes (CNI Inc.) were sonicated in the presence of 1 mg/mL RNA in 100 mM NaCl, 10 mM EDTA pH 7.0. The dispersion was spun at 12,000 g for 10 min and stored at 4° C. FIG. 5 shows a spectrum of the RNA-dispersed carbon nanotubes. The spectrum indicates that the longer wavelength components in the E11 semiconducting region are about half oxidized just on standing in the presence of air. The addition of the reductant, 10 mM sodium dithionite ($Na_2S_2O_4$) shows the restoration of the longest wavelength components to their full amplitude. That the carbon nanotubes have become partially oxidized without the addition of exogenous oxidants means that they have undergone partial oxidation due to oxygen in the air. The potential of the $O_2/2H_2O$ redox couple is 0.82 V vs. NHE at pH 7.0. We know that at pH 7.0 the nucleic acid wrapped-CNTs show a midpoint potential of around 800 mV. The equivalent level of oxidation due to oxygen in the air at pH 7.0 implies that the nanotubes are sensing spectroscopically the presence Of $O_2$ and its thermodynamically reversible redox potential. This observation, the oxidation by exogenous oxidants (e.g. $KMnO_4$ and $K_2IrCl_6$) and the reduction by dithionite indicates the presence of a reversible electron transfer between carbon nanotubes and external redox species.

Example 8

Carbon Nanotube pH Sensor

Figure 6A:
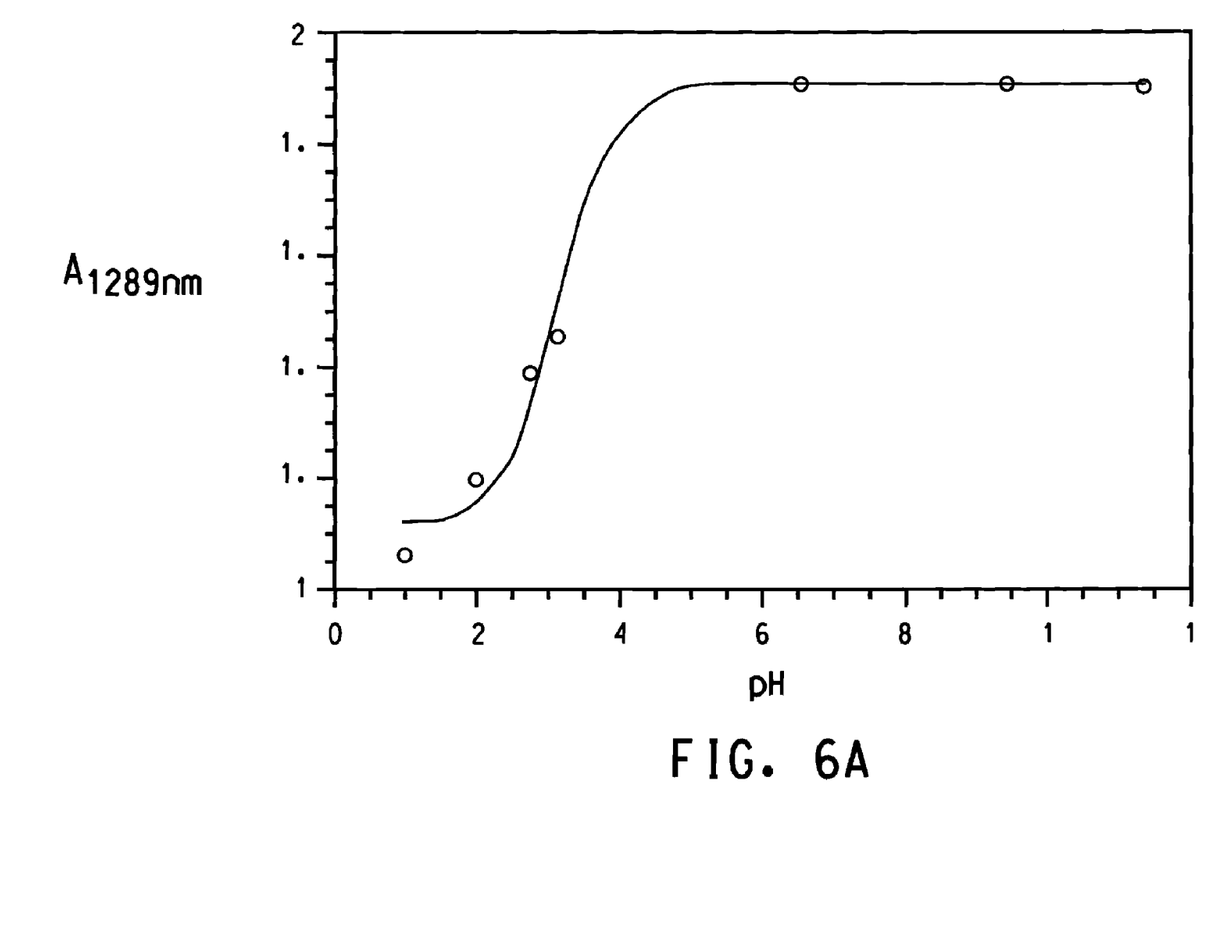
FIG. 6A shows the pH titration of CNTs at 1290 nm with 1% Triton X-405.
Figure 6B:
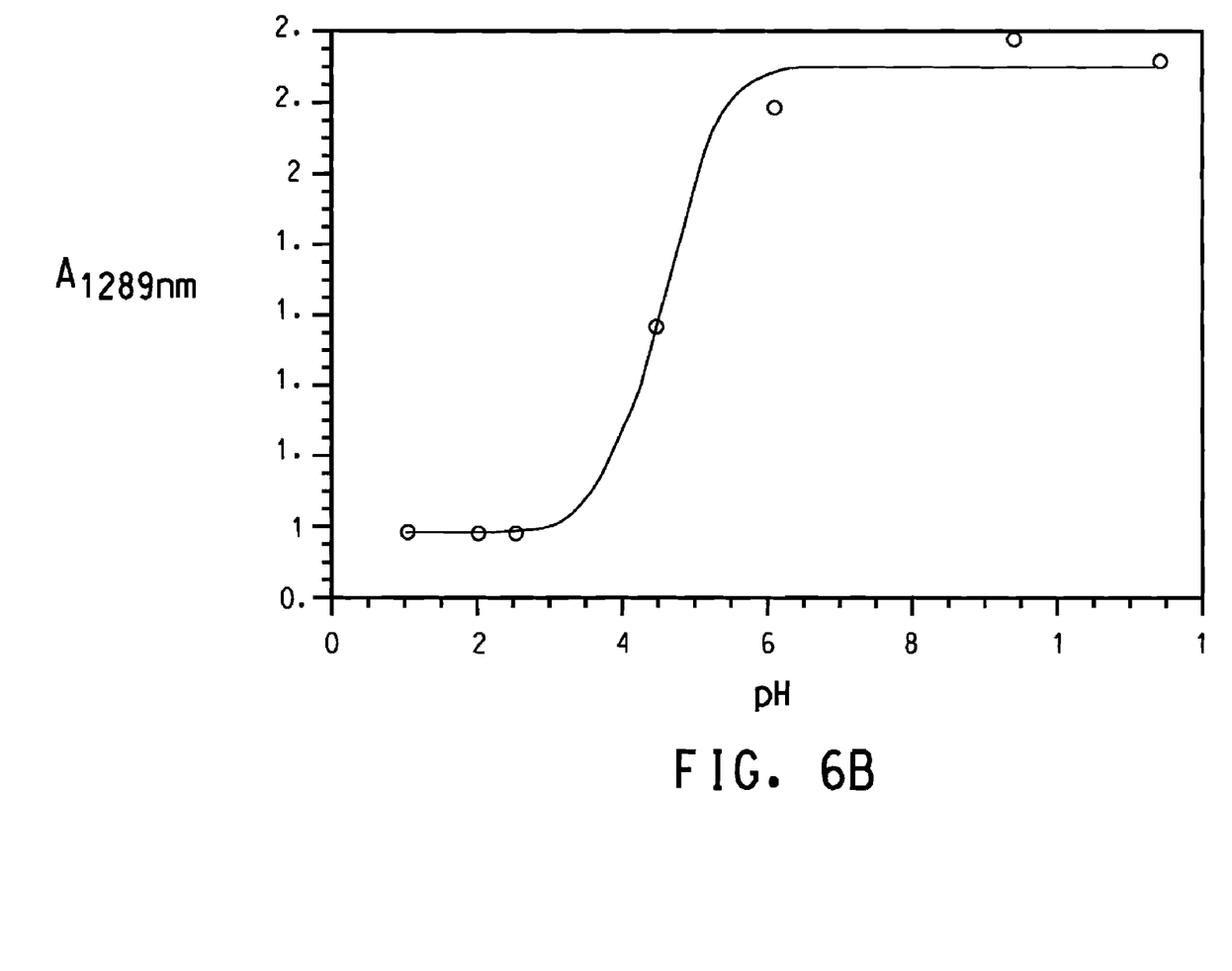
FIG. 6B shows the pH titration of CNTs at 1290 nm with 1% Triton X-405+0.1% SDS.

Because the $O_2/2H_2O$ couple shows a pH dependence of $1H^+/e^-$ whereas the carbon nanotube does not show or shows less of a pH-dependent redox couple, the sensitivity of the CNT redox state to the $O_2/H_2O$ couple allows it to be used as a pH sensor. FIG. 6A shows the dependence of the absorbance at 1290 nm on the pH using carbon nanotubes dispersed with the non-ionic detergent Triton X-405. The same titration repeated in the presence of increasing concentrations of SDS in the presence of Triton X-405, shown in FIG. 6B, shifted the titration to higher pH, consistent with the shift of the reduction potential of the nanotube to lower values upon coating the nanotube with anionic charges. It is also possible that the increasing negative charge has an effect on the pH close to the nanotube surface decreasing with increasing negative charge of the dispersant. In both cases, the nature of the dispersant allows one to tune the nanotube such that its absorbance spectrum tracks the pH over different ranges.

Example 9

Carbon Nanotube Photovoltaic Cell

This example demonstrates the construction of a carbon nanotube based photovoltaic cell. Such a device would operate though the following physical processes: 1. electrons in a carbon nanotube are excited by light from the valence band to the conduction band; 2. excited electrons are withdrawn by an anode, which creates the oxidized state of the carbon nanotube, which is then reduced by a redox mediator; 3. the oxidized mediator is in turn reduced back by the electrons provided by a cathode. It would be expected that the wavelength range would be that of natural sunlight.

There are many possible embodiments of such a device. One type of such a device is shown in FIG. 7. The conducting substrate 10, an optically transparent material, can be made with $TiO_2$; the carbon nanotube film is composed of a blend of semiconducting CNT and a suitable polymer is deposited on the substrate to form the carbon nanotube substrate 20. The conducting substrate 10 and nanotube substrate 20 together form the anode 60. The redox mediator 50 can be the $3I^-/I_3^-$ (iodide/triiodide) redox couple. The electrolyte 40 depends on the particular redox mediator used, but can generally be any electrically conductive solution that is not easily reduced or oxidized, such as aqueous NaCl. The anode and cathode 30 are interchangeable, depending on particular mediator used.

Another embodiment of the device is a solid-state version of the one shown in FIG. 7. Here, the electrolyte is replaced by a wide band gap inorganic semiconductor of p-type, such as CuI or CuSCN, or a hole-transmitting solid such as an amorphous organic arylamine.

Yet another embodiment of the device involves modification of the carbon nanotube surface with a dye sensitizer, such as the black dye tri(cyanato)-2',2',2"-terpyridyl-4,4',4"-tricarboxylate)ruthenium (II).

What is claimed is:

1. A stable charge storage device comprising at least one dispersed oxidized or reduced carbon nanotube in an aqueous solution, said carbon nanotube associated with a nucleic acid dispersant.

2. A charge storage device according to claim 1 wherein the carbon nanotube is selected from the group consisting of single walled nanotubes and multiwalled nanotubes.

3. A charge storage device according to claim 1 wherein the pH of the aqueous solution is less than 7.0.

4. A charge storage device according to claim 1 having a reduction potential from about 900 mV to about 500 mV.

5. A stable charge transfer reagent comprising at least one dispersed oxidized or reduced carbon nanotube in an aqueous solution, said carbon nanotube associated with a nucleic acid dispersant.

6. A charge transfer reagent according to claim 5 wherein the carbon nanotube is selected from the group consisting of single walled nanotubes and multiwalled nanotubes.

7. A charge transfer reagent according to claim 5 wherein the pH of the aqueous solution is less than 7.0.

8. A charge transfer reagent according to claim 5 having a reduction potential from about 900 mV to about 500 mV.

9. A pH sensor comprising at least one dispersed oxidized or reduced carbon nanotube in an aqueous solution, said carbon nanotube associated with a nucleic acid dispersant.

10. A pH sensor according to claim 9 wherein the carbon nanotube is selected from the group consisting of single walled nanotubes and multiwalled nanotubes.

11. A pH sensor according to claim 9 wherein the pH of the aqueous solution is less than 7.0.

* * * * *